United States Patent [19]

McKelvey

[11] Patent Number: 4,466,877
[45] Date of Patent: Aug. 21, 1984

[54] MAGNETRON CATHODE SPUTTERING APPARATUS

[75] Inventor: Harold E. McKelvey, Farmington Hills, Mich.

[73] Assignee: Shatterproof Glass Corporation, Detroit, Mich.

[21] Appl. No.: 540,363

[22] Filed: Oct. 11, 1983

[51] Int. Cl.³ .............................................. C23C 15/00
[52] U.S. Cl. ................................. 204/298; 204/192 R; 204/192 C
[58] Field of Search ................ 204/298, 192 R, 192 C

[56] References Cited

U.S. PATENT DOCUMENTS 3,901,784  8/1975  Quinn et al. ..................... 204/192 C
4,356,073  10/1982  McKelvey ....................... 204/192 R
4,417,968  11/1983  McKelvey ........................... 204/298

Primary Examiner—Arthur P. Demers
Attorney, Agent, or Firm—William E. Nobbe

[57] ABSTRACT

A magnetron cathode sputtering apparatus including a pair of rotary cylindrical sputtering targets mounted in spaced parallel relation in an evacuable coating chamber and separate magnetic means located within said targets, the magnetic means being oriented relative to one another such that the material sputtered therefrom will be directed inwardly and downwardly at an acute angle whereby the sputtered material from the two targets will be focused upon the substrates.

14 Claims, 3 Drawing Figures

4,466,877

MAGNETRON CATHODE SPUTTERING APPARATUS

FIELD OF THE INVENTION

The present invention relates to magnetron cathode sputtering apparatus and, in particular, to novel rotary magnetron sputtering apparatus for laying down metal films such as are required for silicon integrated circuits.

SUMMARY OF THE INVENTION

One of the objects of this invention is to provide a rotatable magnetron sputtering apparatus of improved design in which the sputtering material transferred from the target to the substrates is significantly increased and the deposition rate greatly magnified.

Another object of the invention is to provide rotatable magnetron cathode sputtering apparatus of improved design in which the sputtered material is transferred to the substrates in such a manner that it is concentrated on a more localized area of the substrate surface.

A further object of the invention is to provide rotatable magnetron cathode sputtering apparatus including a pair of rotary sputtering targets having separate magnetic means located therein and oriented relative to one another to focus the material sputtered from the targets upon the substrates.

DESCRIPTION OF THE PREFERRED EMBODIMENT

Figure 1:
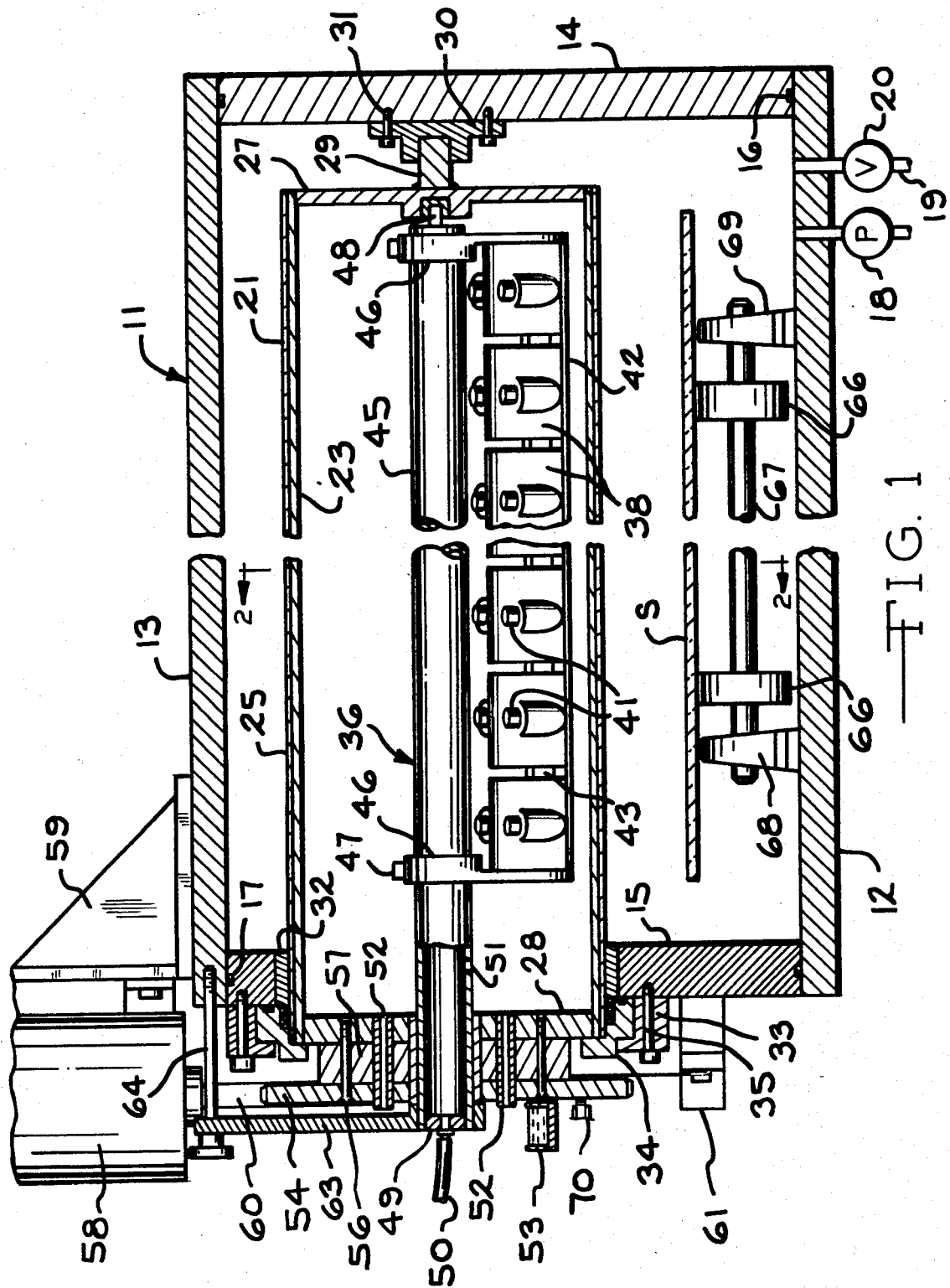
FIG. 1 is a vertical longitudinal section through a coating chamber showing in elevation a magnetron cathode constructed in accordance with the present invention mounted therein.

Referring now to the drawings, the sputtering apparatus of this invention is designated in its entirety by the numeral 10 is mounted in an evacuable coating chamber 11. The coating chamber is rectangular and is composed of a bottom wall 12, top wall 13, opposite end walls 14 and 15 and side walls (not shown). The bottom and top walls 12 and 13 are suitably joined to the end walls 14 and 15 at the hermetic seals 16 and 17 respectively. The side walls are similarly sealed to the top and bottom and end walls. A vacuum pump 18 is provided to evacuate the coating chamber 11 to the desired pressure. If desired, gases may be injected into the chamber through a conduit 19 controlled by a valve 20.

Figure 2:
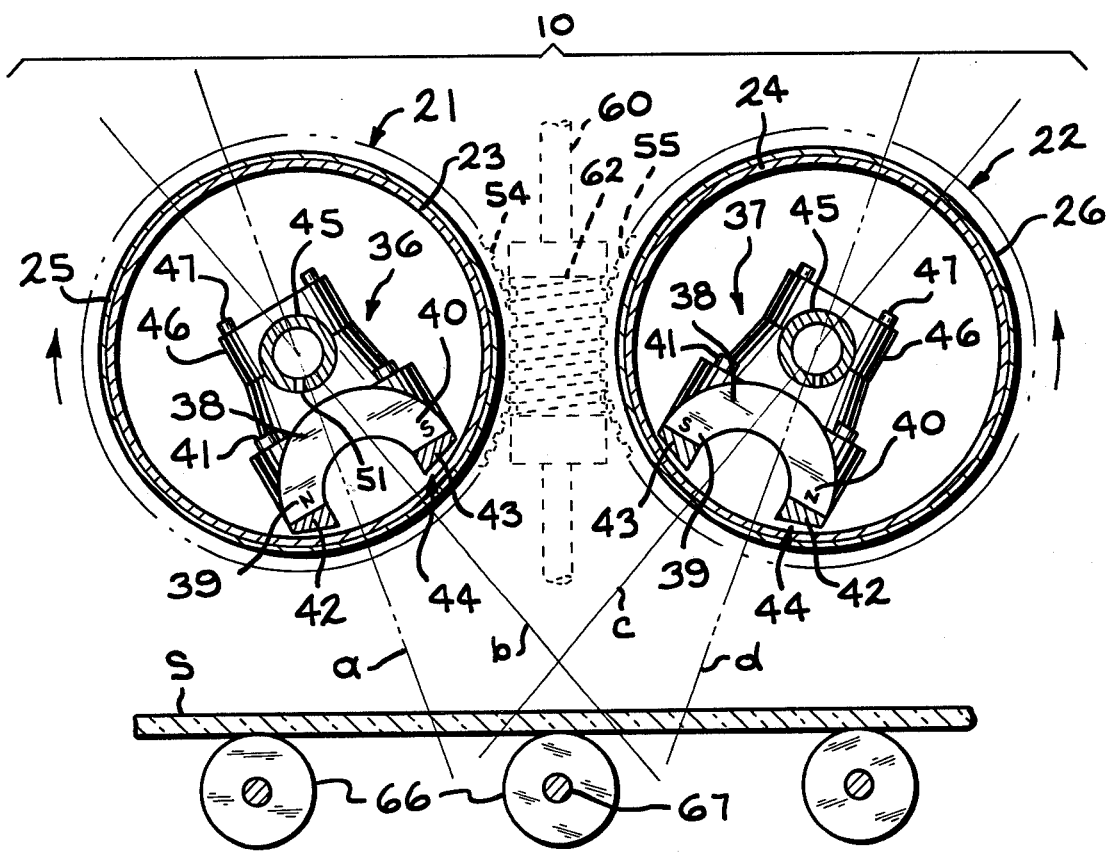
FIG. 2 is a vertical transverse section taken substantially on line 2—2 of FIG. 1.
Figure 3:
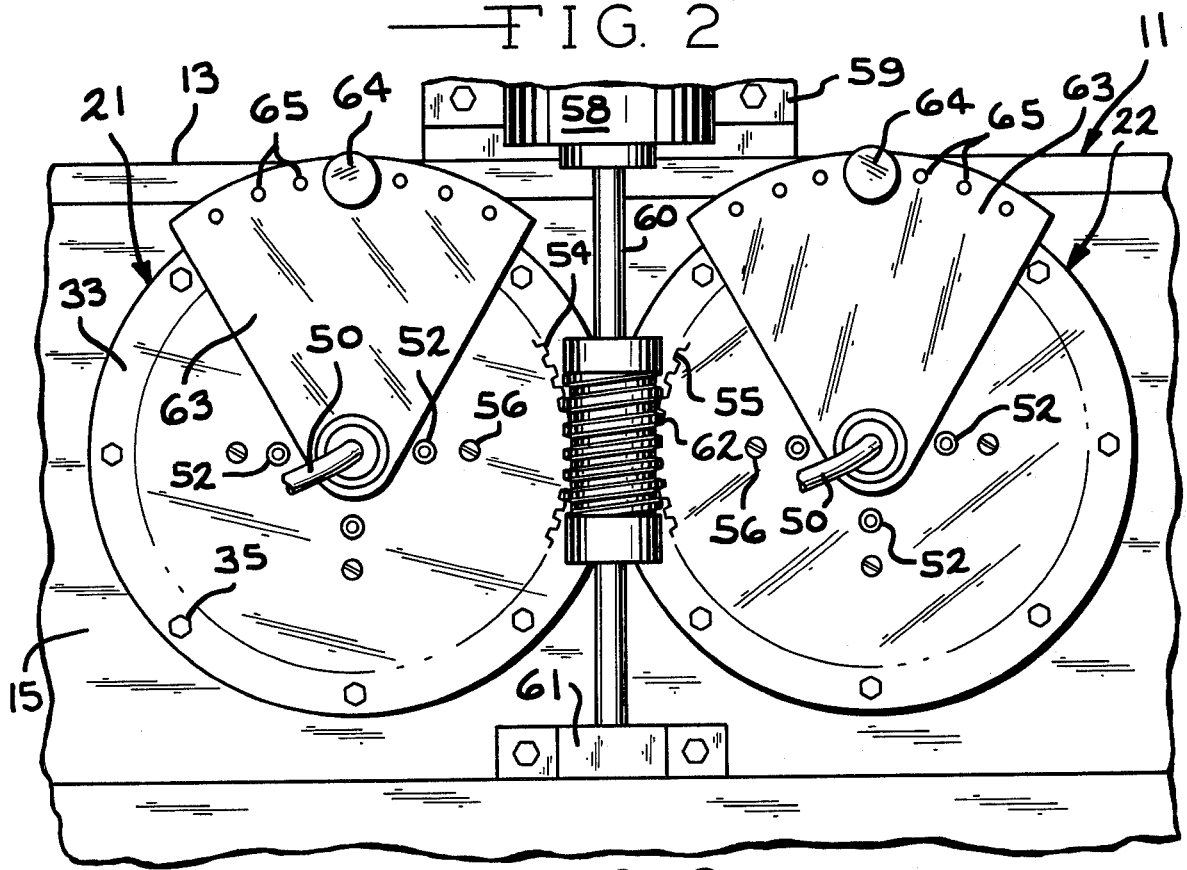
FIG. 3 is an end view of the apparatus.

The sputtering apparatus 10 comprises a pair of rotary cathodes 21 and 22 mounted in the coating chamber 11 in horizontally spaced, parallel relation as indicated in FIG. 2. The cathodes 21 and 22 comprise elongated cylindrical tubular members 23 and 24 respectively having applied to the outer surfaces thereof layers 25 and 26 respectively of the material to be sputtered.

The tubular members 23 and 24 are formed of a suitable non-magnetic material such as brass or stainless steel and are of a diameter, wall thickness and length required for the operation to be performed. Each said tubular member is closed at its opposite ends by the inner and outer walls 27 and 28 respectively. The inner end wall 27 is supported by a trunnion 29 received in a bracket 30 secured to the end wall 14 of the coating chamber by screws 31. The tubular member is received at its outer end in a bushing 32 in the end wall 15 of coating chamber 11. Sealing collars 33 and 34 surround the tubular member and are secured to the end wall 15 of the coating chamber by screws 35.

Located within the tubular members 23 and 24 are the magnetic means 36 and 37 respectively, each comprising a plurality of permanent magnets 38 aligned with one another in a single row and extending substantially the length of the tubular member. The permanent magnets herein provided are substantially U-shaped magnets and have secured to the legs 39 and 40 thereof, by screws 41, the relatively narrow magnetic strips 42 and 43. The bottom surfaces 44 of said magnetic strips are shaped to conform to the curvature of the inner surface of the tubular member and are positioned closely adjacent thereto.

As illustrated in FIG. 2, the magnetic means 36 and 37 are oriented relative to one another such that the magnets 38 thereof are at an acute angle and direct the sputtered material downwardly and inwardly to focus it upon the substrates S that are located therebeneath. Due to this configuration of the magnetic means the material sputtered from the two targets will merge or combine at a point adjacent the substrates and concentrate the sputtering action on a relatively smaller area thereof than will planar substrates or regular rotary cathodes. The deposition rate will be magnified several times.

For the purpose of cooling the substrates, there is provided in each tubular member 23 and 24 a coolant conduit 45, also formed of a non-magnetic material and extending longitudinally within the lower portion of the associated tubular member and from which the magnetic means 36 or 37 is suspended by hanger brackets 36 that encircle the tubular member and are secured thereto by screws 47. The inner end of said conduit 45 is provided with a trunnion 48 that is supported in the end wall 27 of the tubular member.

The outer end portion of the coolant conduit 45 extends through an opening in the end wall 28 of the tubular member and is closed by a cap 49. A cooling medium, such as water, is introduced into the outer end of the conduit 45 through a pipe 50 and exits therefrom through openings 51 in said conduit. After circulating through the cathode, the cooling medium is discharged therefrom through a pipe 52 into a receptacle or the like 53.

During the operation of the apparatus, the tubular members 23 and 24 are rotated, while the magnets 38 remain stationery. The means for rotating the tubular members 23 and 24 include worm gears 54 and 55 respectively secured to the end walls of said tubular members by screws 56 which also pass through spacer plates 57. A motor 58 is carried by a bracket 59 mounted upon the top wall 13 of the coating chamber and is provided with a depending drive shaft 60 journaled at its lower end in a bearing 61 and having keyed thereto a worm 62 which meshes with the worm gears 54 and 55. Upon operation of the motor the tubular members 23 and 24 will be driven in opposite directions as indicated by the arrows in FIG. 2.

The means for maintaining the magnetic means 36 and 37 stationery during rotation of the tubular members comprises a substantially triangular locking plate 63 secured at its lower end to the respective coolant conduit 45 and fastened at its upper end by a rod 64 that passes through a hole 65 in the lockaing plate 63 and is received in an opening in the top wall 13 of the coating chamber.

The invention contemplates means for adjusting the angle of the magnetic means 36 and 37 to change the focus of the coating material upon the substrates, whereby to increase or decrease the area covered by the sputtered material. To this end, each locking plate 63 is provided along its upper edge with a plurality of holes 65 that are adapted to selectively receive the fastening rod 64 depending upon the adjustment of the locking plate.

When it is desired to change the orientaion of the magnetic means 36 and 37, the rod 64 is withdrawn from the opening in the coating chamber, the locking plate 63 turned to rotate the coolant conduit 45 about its longitudinal axis, which will also rotate the magnetic means. After the desired orientation of the magnetic means has been attained, the rod 64 is inserted through the appropriate hole 65 into the opening in the top wall of the coating chamber. In this way, the magnetic means may be adjusted through a relatively wide arc as indicated by the broken lines a-b and c-d in FIG. 2.

It will be noted that several discharge pipes 52 are provided for the cooling medium so that, upon adjustment of the locking plate 63 one of these pipes will be brought into position to receive the cooling medium discharged from the tubular member.

The substrates S to be coated may be transported through the coating chamber during operation of the apparatus by any suitable conveying means such as upon rollers 66 fixed to shafts 67 journaled in bearing blocks 68 and 69 supported upon the bottom wall of the coating chamber.

The cathodes 21 and 22 are preferably about two to three inches in diameter and the substrates S are located about two inches from the cathodes. The outer legs of the permanent magnets 38 constitute the north poles and the inner legs the south poles as indicated in FIG. 2. The magnetic field flows longitudinally of the tubular members 23 and 24 and jumps the gap between the tubular members at the adjacent ends thereof to establish a magnetic field in the form of a closed loop or race track.

A cathode potential sufficient to cause sputtering to occur is supplied to the target material from a D.C. power source (not shown) through a contact 70 having sliding or rolling engagement with the tubular members. The apparatus may be grounded through the coating chamber 11.

While there has been illustrated and described herein a preferred embodiment of the invention, it will be understood that changes and modifications may be made without departing from the spirit of the invention or scope of the appended claims.

I claim:

1. Magnetron cathode sputtering apparatus, comprising a pair of elongated rotatable sputtering targets mounted in horizontally spaced parallel relation in an evacuable coating chamber for sputter-coating substrates also located in said chamber beneath said targets, and separate magnetic means located in said targets, said magnetic means being disposed at an angle to one another to focus the material sputtered from said targets upon said substrates.

2. Magnetron cathode sputtering apparatus as claimed in claim 1, in which said magnetic means are oriented such that the sputtered material therefrom is directed inwardly and downwardly upon said substrates.

3. Magnetron cathode sputtering apparatus as claimed in claim 1, including means for changing the angle of said magnetic means to vary the focus of the sputtered material upon the substrates.

4. Magnetron cathode sputtering apparatus as claimed in claim 2, including means for adjusting the orientation of said magnetic means to vary the concentration of the sputtered material upon the substrates.

5. Magnetron cathode sputtering apparatus as claimed in claim 1, including means for rotating said sputtering targets, and means for maintaining said magnetic means stationery.

6. Magnetron cathode sputtering apparatus as claimed in claim 3, including means for rotating said sputtering targets, and means for maintaining said magnetic means stationery.

7. Magnetron cathode sputtering apparatus as claimed in claim 1, including means for individually changing the angle of said magnetic means, and means for locking said magnetic means in adjusted postion.

8. Magnetron cathode sputtering apparatus as claimed in claim 2, including means for rotating said sputtering targets, and means for maintaining said magnetic means stationery.

9. Magnetron cathode sputtering apparatus as claimed in claim 1, in which said sputtering targets comprise elongated, cylindrical tubular members having a coating of the material to be sputtered applied thereto, and in which said magnetic means are located in said tubular members.

10. Magnetron cathode sputtering apparatus as claimed in claim 9, in which said magnetic means comprise permanent magnets.

11. Magnetron cathode sputtering apparatus as claimed in claim 10, including means for rotating said tubular members, and means for maintaining said permanent magnets stationery.

12. Magnetron cathode sputtering apparatus as claimed in claim 11, including means for adjusting the angle of said permanent magnets, and means for locking said magnets in adjusted position.

13. Magnetron cathode sputtering apparatus as claimed in claim 10, including a coolant conduit mounted lengthwise in each tubular member, in which the permanent magnets extend lengthwise of the tubular members and are supported thereby, and means for individually rotating said conduits about their longitudinal axes to vary the angle of the permanent magnets.

14. Magnetron cathode sputtering apparatus as claimed in claim 13, including means for rotating said tubular members, and means for maintaining said conduits stationery.

* * * * *